(12) United States Patent
Fukuhara et al.

(10) Patent No.: US 6,515,601 B2
(45) Date of Patent: Feb. 4, 2003

(54) NOISE SHAPER

(75) Inventors: Yukio Fukuhara, Tokyo (JP); Akira Toyama, Kanagawa-ken (JP)

(73) Assignee: Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 09/929,171

(22) Filed: Aug. 14, 2001

(65) Prior Publication Data

US 2002/0041243 A1 Apr. 11, 2002

(30) Foreign Application Priority Data

Aug. 25, 2000 (JP) ........................................ 2000-255639

(51) Int. Cl.[7] .............................. H03M 1/20; H03M 3/00
(52) U.S. Cl. ....................................... 341/131; 341/143
(58) Field of Search ................................. 341/131, 143, 341/155; 329/320, 336; 348/574; 704/229; 331/18, 16; 708/313

(56) References Cited

U.S. PATENT DOCUMENTS

| | | | | |
|---|---|---|---|---|
| 4,772,853 A | * | 9/1988 | Hart | 329/336 |
| 4,839,606 A | * | 6/1989 | Hallock | 329/320 |
| 4,968,987 A | * | 11/1990 | Naka et al. | 341/143 |
| 5,550,544 A | * | 8/1996 | Sakiyama et al. | 341/155 |
| 5,649,054 A | * | 7/1997 | Oomen et al. | 704/229 |
| 5,825,253 A | * | 10/1998 | Mathe et al. | 331/18 |
| 5,940,138 A | * | 8/1999 | Lowe | 348/574 |
| 6,326,911 B1 | * | 12/2001 | Gomez et al. | 341/143 |

FOREIGN PATENT DOCUMENTS

JP 05-102851 4/1993

* cited by examiner

*Primary Examiner*—Patrick Wamsley
(74) *Attorney, Agent, or Firm*—Jordan and Hamburg LLP

(57) ABSTRACT

A pole-shifted noise shaper whose transfer function has a Z-plane in which the pole has been shifted out of the origin. The noise shaper suppresses idle pattern. The noise shaper has a dither adder (17) placed immediately before a quantizer (16) to add a dither signal to data about to be applied to the quantizer (16). This suppresses attenuation of the dither signal due to noise shaping. Therefore, the dither signal can be supplied effectively. The idle pattern appearing in the output signal can be suppressed. Since the pattern of the dither signal is varied at a frequency that is 1/16 to 1/8 of the frequency of the operating clock signal, the frequency of noise component due to the dither signal lowers. The signal and the dither signal component can be easily separated in a rear stage.

10 Claims, 6 Drawing Sheets

[PRIOR ART]

NOISE SHAPER

BACKGROUND OF THE INVENTION

1. Field of the Invention

The present invention relates to a noise shaper used in a Δ-Σ (delta-sigma) digital-to-analog (D/A) converter, digital-to-digital (D/D) converter, or the like and, more particularly, to a noise shaper for suppressing the idle pattern by means of a dither signal.

2. Description of the Related Art

A noise shaping technique consisting of reconverting an oversampled signal into a signal of a less number of bits by a quantizer and feeding quantization noise induced by the requantization back into the next signal to shift the quantization error to the higher-frequency side for reducing noise within the signal band is used in Δ-Σ (delta-sigma) D/A conversion and D/D conversion. Where this noise shaping is implemented, an idle pattern having a certain pattern at quite low levels of the input signal is produced. An intrinsic spectrum is produced within the audio band, thus deteriorating the sound quality.

In the past, therefore, a dither generator for supplying a quite low level of dither signal to an input signal at high frequencies has been used. For example, in Japanese Patent Laid-Open No. 102851/1993, a D/A converter for adding a dither signal to a signal that is input to a noise shaper 81 as shown in FIG. 8 is disclosed, the dither signal being generated by a dither generator circuit 82.

In the field of digital audio technology, noise shapers of higher orders have been used because further improvement of sound quality has been required. Concomitantly, noise components at higher frequencies have increased. This has placed a great load on the rear-stage, low-pass filter. To solve this problem, an attempt has been made to suppress noise components at high frequencies by the use of a pole-shifted noise shaper in which the pole on the Z-plane of the transfer function of the whole system has been shifted out of the origin. As illustrated in FIG. 9, this system implements feedback to an adder 92 from a quantizer 91 by a transfer function G(Z). This is subtracted from the input signal. Thus, feedforward is provided to the quantizer 91 with the transfer function G(Z). The output data Y(n) is herein abbreviated Y and given by $$Y=(X-Y \cdot H) \cdot G + Q$$

where H is a transfer function H(Z), G is a transfer function G(Z), X is input data X(n), and Q is quantization noise in a quantizer X1. Thus, we have $$Y = \frac{G}{1+G \cdot H} X + \frac{Q}{1+G \cdot H}$$

It can be seen from this that a pole shift has occurred and that the input signal attenuates with increasing the frequency. One example of a pole-shifted noise shaper is shown in FIG. 10. This is a third-order noise shaper consisting of integrators 101–103, adders 104–107, coefficient multipliers 108–111, and a quantizer 112. Feedback is provided to the input side from the quantizer 112. In addition, feedback is provided to the integrator 102 from the integrator 103 via the adder 107 and via the coefficient multiplier 111.

In the pole-shifted noise shaper, the input signal attenuates with increasing the frequency. Therefore, if the signal to which the dither signal is added as shown in FIG. 8 is subjected to noise shaping, the dither signal attenuates. Consequently, the idle pattern cannot be suppressed sufficiently.

Furthermore, noise components at higher frequencies are increased by adding the dither signal. This increases the load on the low-pass filter positioned behind the noise shaper. For this reason, if attempts are made to reduce noise components at higher frequencies using a pole-shifted noise shaper, the effect is canceled to some extent.

SUMMARY OF THE INVENTION

The present invention provides a pole-shifted noise shaper in which the pole on the Z-plane of the transfer function has been shifted out of the origin, the noise shaper being characterized in that it is equipped with a dither adder for adding a dither signal to data that is about to be applied to a quantizer. In consequence, the idle pattern can be suppressed more effectively.

Preferably, the above-described dither signal varies periodically regardless of the aforementioned data, and its spectrum is based on a certain frequency that is higher than the audio band and lower than the operating clock frequency.

Preferably, the dither signal is produced based on a certain pattern consisting of combinations of "1" and "0". The dither adder described above sequentially selects the bits of the certain pattern at the certain frequency, adds a certain level to them, and produces the dither signal.

It is desired that the certain frequency described above be $\frac{1}{16}$ to $\frac{1}{8}$ of the operating clock frequency of the noise shaper.

The level of the above-described dither signal is preferably $\frac{1}{16}$ to $\frac{1}{8}$ of the maximum amplitude, or the most significant bit, of the data described above.

Preferably, the aforementioned noise shaper converts a multi-bit digital signal into a 1-bit digital signal.

DESCRIPTION OF THE PREFERRED EMBODIMENTS

Figure 1:
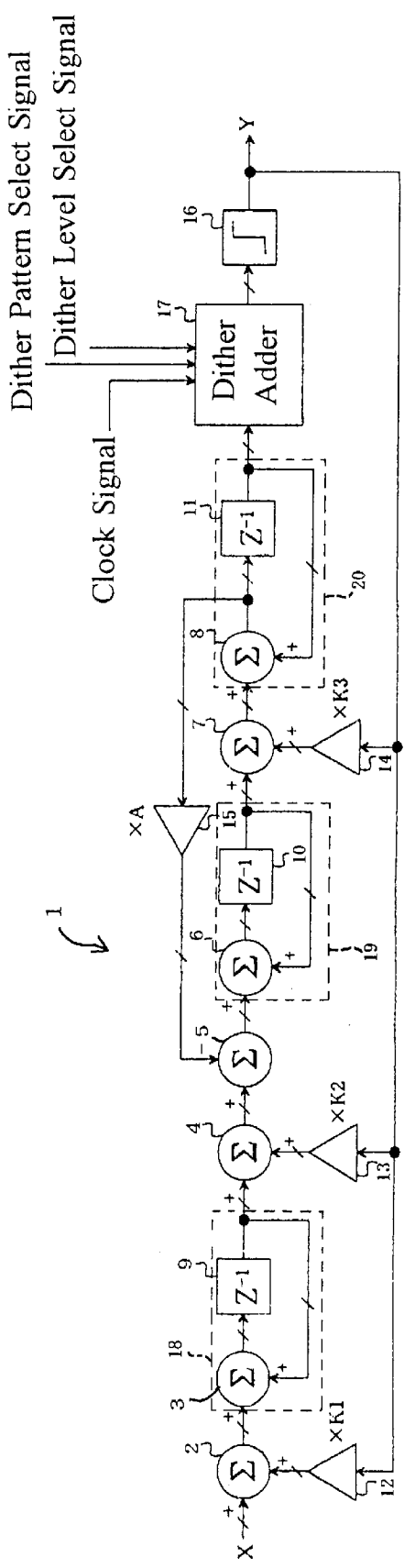
FIG. 1 is a block diagram illustrating the configuration of a noise shaper in accordance with one embodiment of the present invention.

The present invention is hereinafter described in detail using its preferred embodiments by referring to the accompanying drawings. FIG. 1 is a block diagram illustrating the configuration of a noise shaper in accordance with an embodiment of the present invention.

A noise shaper 1 is a third-order noise shaper. For instance, 24-bit input data X obtained by oversampling 24-bit data at 128×44.1 kHz by an oversampling circuit (not shown) is used as an input signal, the 24-bit data being sampled at 44.1 kHz. The noise shaper 1 is composed of adders 2–8, delay units 9–11, coefficient multipliers 12–15, a quantizer 16, and a dither adder 17.

The adder 2 adds up data and input data, the former data being obtained by multiplying the output data from the quantizer 16 by a certain coefficient by means of the coefficient multiplier 12. In the present embodiment, the quantizer 16 produces 1-bit data. The coefficient multiplier 12 produces 24-bit data of the certain coefficient having a sign that is positive or negative, depending on whether the output data from the quantizer 16 is "0" or "1", respectively. The coefficient multipliers 13 and 14 operate in the same way as the coefficient multiplier 12. The adder 3 sums up the input data and data delayed by an amount corresponding to one clock pulse of the operating clock signal of the noise shaper 1 (i.e., the clock signal of the oversampling frequency) by means of the delay unit 9. That is, the adder 3 and the delay unit 9 together form an integrator 18, which integrates the output data from the adder 2. The coefficient multiplier 13 multiplies the output data from the quantizer 16 by a certain coefficient, and the adder 4 adds the output data from the integrator 18 to the output data multiplied by means of the multiplier 13. The adder 5 adds the output data from the coefficient multiplier 15 to the output data from the adder 4. The coefficient multiplier 15 makes the sign of the coefficient negative, and produces data obtained by multiplying the output data from the adder 8 by a certain coefficient. The adder 6 and the delay unit 10 together constitute an integrator 19 acting to integrate the output data from the adder 5. The coefficient multiplier 14 multiplies the output data from the quantizer 16 by a certain coefficient, and the adder 7 adds the output data from the integrator 19 to the data produced by this multiplication. The adder 8 and the delay unit 11 together form an integrator 20 serving to integrate the output data from the adder 7. The dither adder 17 is a circuit for adding a dither signal to data entered at an oversampling frequency. This dither signal varies at a frequency that is ⅟₁₆ to ⅛ of the oversampling frequency and at a level that is ⅟₁₆ to ⅛ of the maximum amplitude, or the most significant bit (MSB), of the oversampled data. The output data from the dither adder 17 is requantized by the quantizer 16.

Since the noise shaper 1 constructed as described thus far suppresses increase of noise components at high frequencies, its transfer function is so characterized that the pole is shifted from the origin on the Z-plane. The output signal attenuates with increasing frequency of the input signal.

Figure 2:
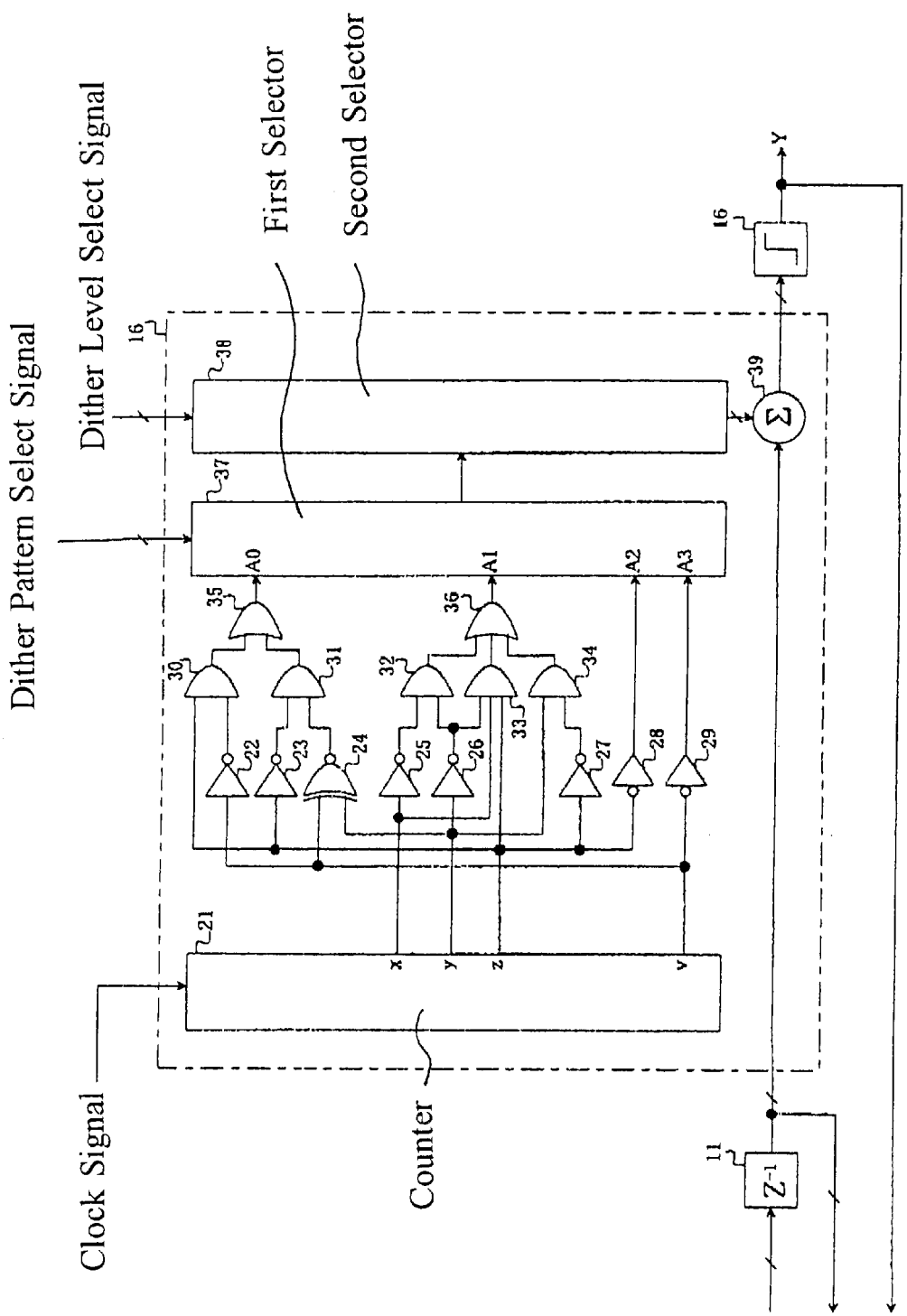
FIG. 2 is a block diagram illustrating the configuration of a dither adder shown in FIG. 1.

Specifically, the dither adder 17 is constructed as shown in FIG. 2. A counter 21 counts a clock signal having a frequency that is ⅟₁₆ or ⅛ of the oversampling frequency. In this embodiment, it is assumed that the counter counts the clock signal of a ⅛ frequency. Logic circuits 22–36 produce a pattern of a dither signal according to the count value obtained by the counter 21. A first selector 37 selects one of terminals A0, A1, A2, and A3 connected with the logic circuits 35, 36, 28, and 29, respectively, according to a dither pattern-selecting signal, and produces an output indicative of the logic state. A second selector 38 shifts the output from the first selector 37 within a range of ⅟₁₆ to ⅛ of the maximum amplitude, or the MSB, of the data oversampled according to the dither signal level select signal and creates a dither signal at a certain level. An adder 39 adds the dither signal produced from the selector 37 to the output from the delay unit 11.

The operation of the present embodiment, especially the operation of the dither adder 17 for producing the dither signal, is next described. In the dither adder 17, the counter 21 counts a clock signal and produces a 4-bit count value at output terminals v, z, y, and x cyclically. The count value cycles among 0000, 0001, 0010, 0011, 0100, 0101, 0110, 0111, 1000, 1001, 1010, 1011, 1100, 1101, 1110, and 1111. In the first selector 37, if the terminal A0 is selected according to the dither pattern-selecting signal, a dither pattern assuming 1, 1, 0, 0, 1, 1, 1, 1, 0, 0, 1, 1, 0, 0, 0, and 0 at every count value of the counter is produced from the terminal A0. Besides the foregoing, (1, 0, 1, 1, 0, 1, 0, 0, 1, 0, 1, 1, 0, 1, 0, 0), (1, 1, 1, 1, 1, 1, 1, 1, 0, 0, 0, 0, 0, 0, 0, 0), and (1, 1, 1, 1, 0, 0, 0, 0, 1, 1, 1, 1, 0, 0, 0, 0) can be selected at the first selector 37 by selecting the terminals A1, A2, and A3, respectively. These patterns are shaped into a dither signal at a certain level in the second selector 38 within the range of ⅟₁₆ to ⅛ of the maximum amplitude, or the most significant bit (MSB), of the input data X according to the dither signal-selecting signal. The level of the dither signal is set to a relatively large level of ⅟₁₆ to ⅛ of the MSB, taking account of attenuation due to noise shaping.

The combination of the pattern of the dither signal and the level is previously appropriately set. That is, the optimum combination of the pattern and level is determined, depending on the oversampling frequency that is the operating clock frequency of the noise shaper 1, on the clock frequency of the dither adder, and on other factors. In the present embodiment, the selectors 37 and 38 are provided to be capable of coping with plural oversampling frequencies. The dither adder may be specialized for one oversampling frequency, and the dither signal may have previously determined pattern and level.

The adder 39 adds the output data from the selector 38 to the output from the delay unit 11. As a result, data about the dither signal is fed back to the noise shaper 1 via the quantizer 16, whereby the processed signal can be dithered. It is also possible to dither the signal by subtracting the dither signal whose level is set as mentioned above when the dither signal pattern is 0.

In the present embodiment, a dither signal is added immediately before the quantizer 16. Therefore, attenuation of the dither signal due to the noise shaping operation of the noise shaper 1 can be suppressed. Consequently, if increase of noise in the output signal at high frequencies is suppressed by moving the pole out of the origin of the Z-plane of the transfer function of the noise shaper 1, i.e., if the output signal attenuates with increasing the frequency of the input signal, dither can be performed effectively. In this way, the idle pattern can be suppressed more effectively than heretofore.

Figure 3:
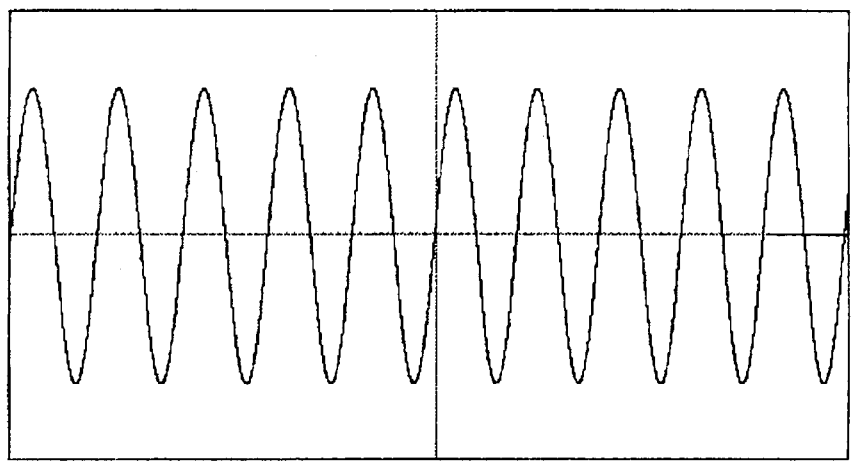
FIG. 3 is a waveform diagram showing one example of a signal input to the noise shaper shown in FIG. 1.
Figure 4:
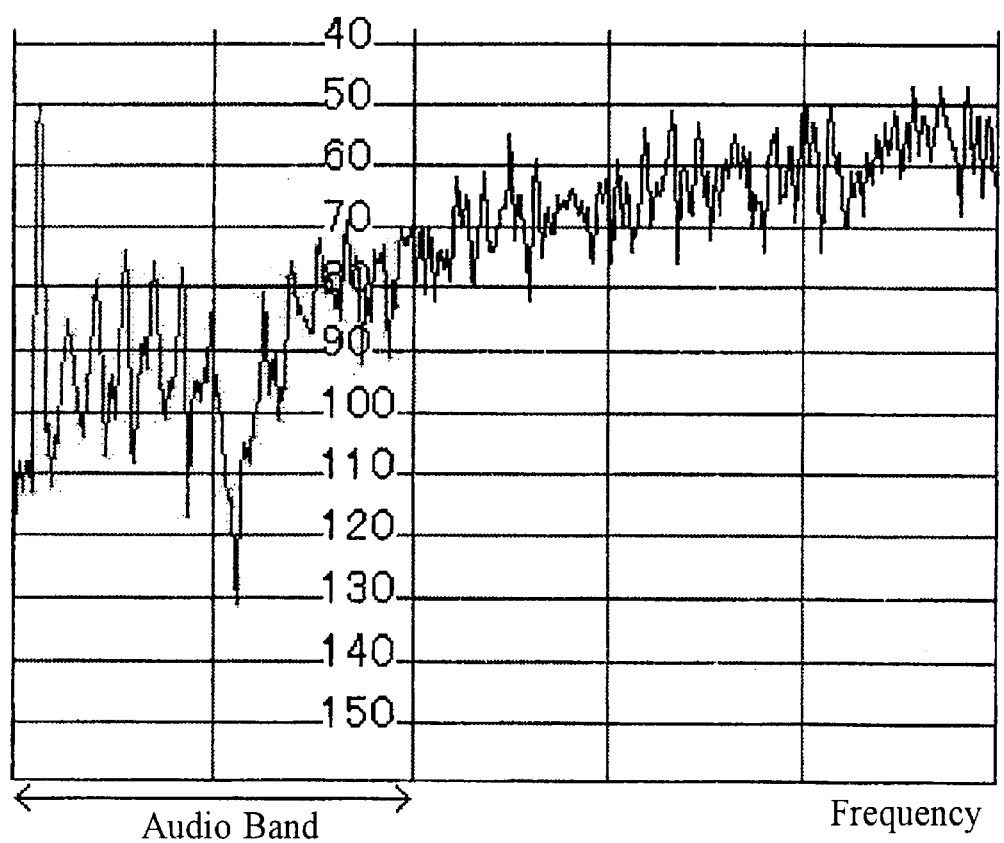
FIG. 4 is a spectrum of the output signal from the noise shaper shown in FIG. 1 where the input signal shown in FIG. 3 is applied and a dither signal is added.
Figure 5:
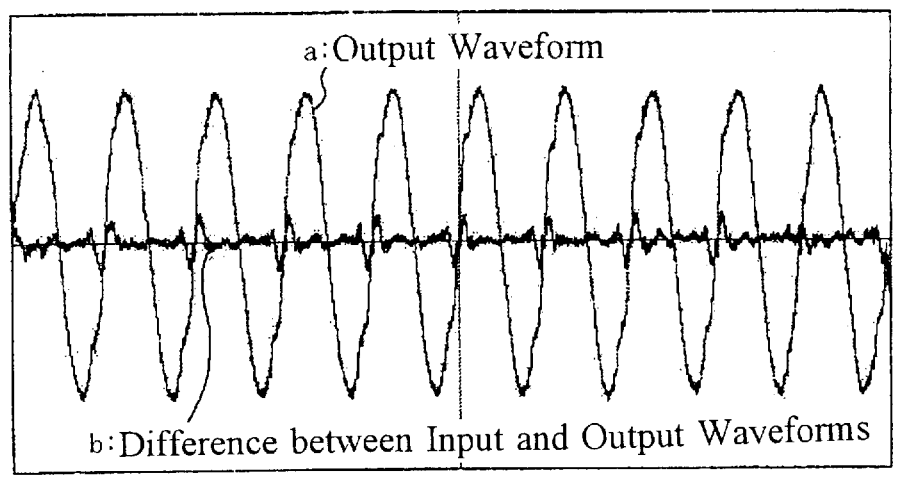
FIG. 5 is a diagram of the differential waveform between the output signal from the noise shaper shown in FIG. 1 and the input signal shown in FIG. 3 where this input signal is applied and a dither signal is added.
Figure 6:
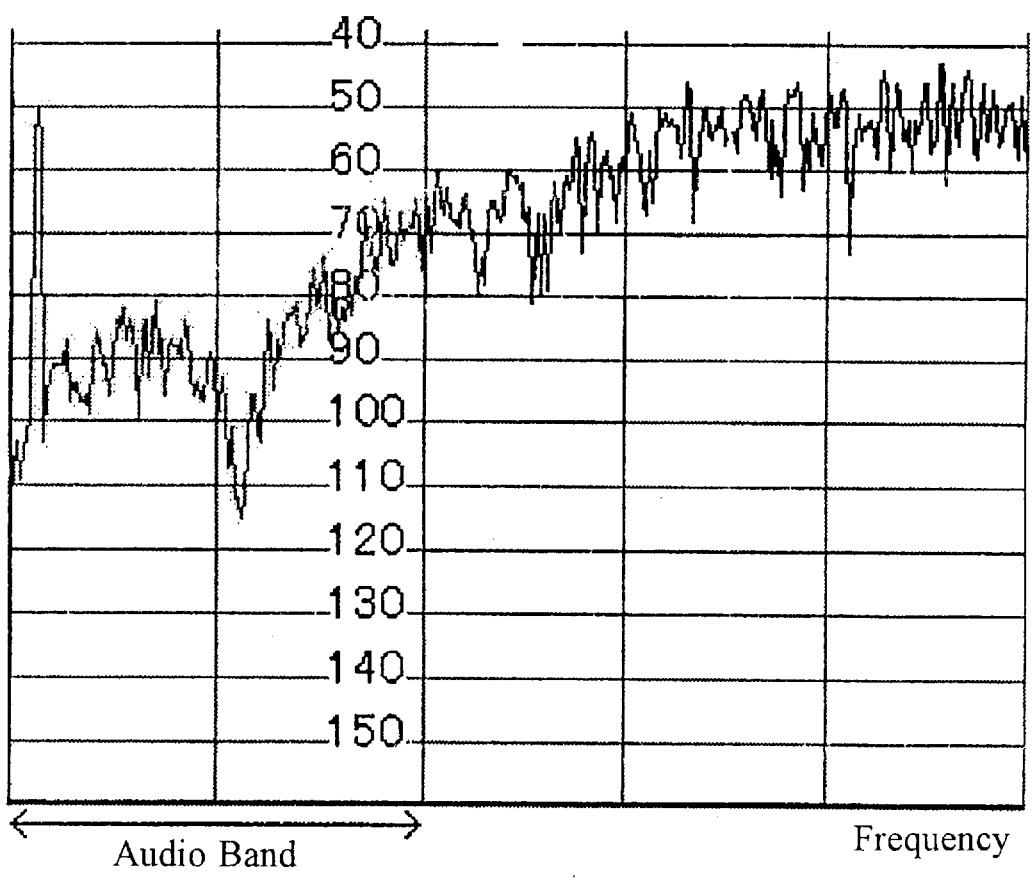
FIG. 6 is a spectrum of the output signal from the noise shaper shown in FIG. 1 where the input signal shown in FIG. 3 is applied and no dither signal is added.
Figure 7:
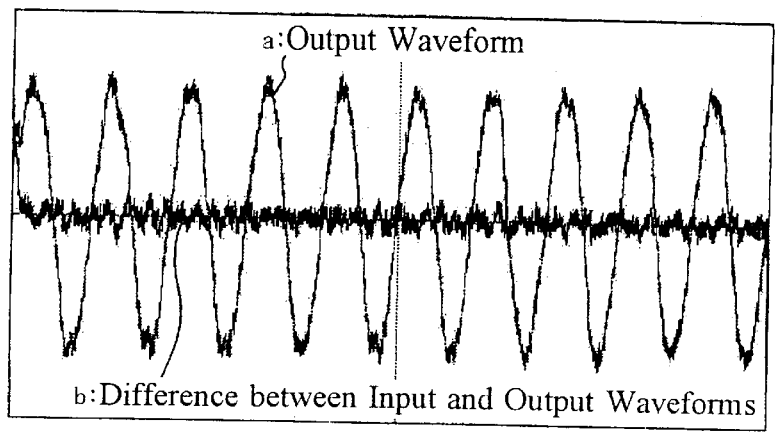
FIG. 7 is a diagram of the differential waveform between the output signal from the noise shaper shown in FIG. 1 and the input signal shown in FIG. 3 where this input signal is applied and no dither signal is added.
Figure 8:
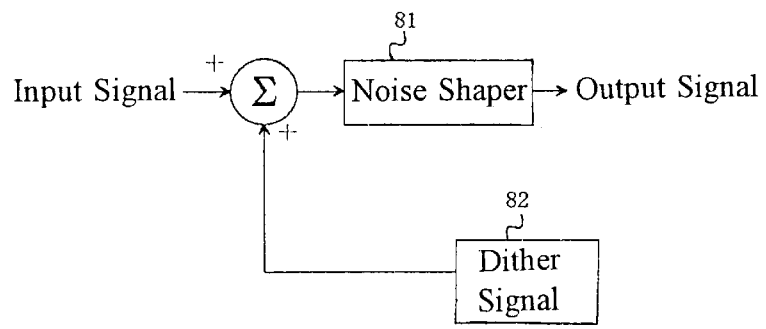
FIG. 8 is a block diagram illustrating the configuration of a conventional noise shaper.
Figure 9:
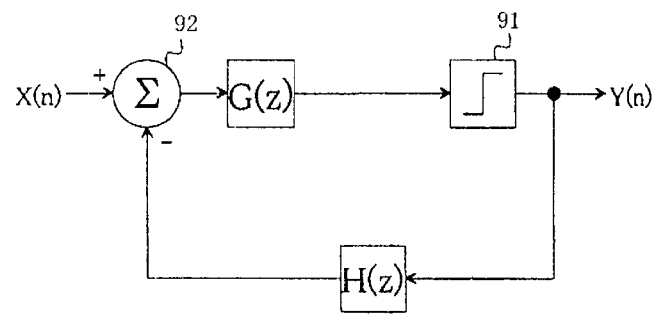
FIG. 9 is a block diagram illustrating the configuration of another conventional noise shaper.
Figure 10:
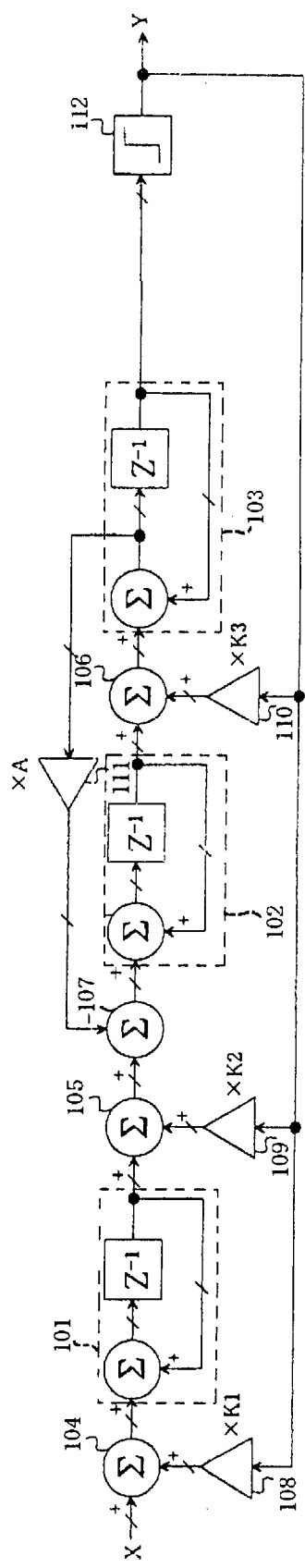
FIG. 10 is a block diagram illustrating the configuration of a further conventional noise shaper.

With respect to this point, a case in which input data at a quite low level of the waveform shown in FIG. 3 is applied to the noise shaper 1 and dither is added by the dither adder 17 and a case in which dither is not added are compared as follows. Where dither is added by the dither adder 17, the output spectrum from the noise shaper 1 assumes the form shown in FIG. 4. The output waveform is indicated at a of FIG. 5. The differential waveform between the input waveform and the output waveform is indicated at b of FIG. 5. On the other hand, where no dither is added, the output spectrum from the noise shaper 1 assumes the form as shown in FIG. 6. The output waveform is indicated at a of FIG. 7. The differential waveform between the input waveform and the output waveform is indicated at b of FIG. 7. Where a dither signal is added as shown in these figures, generation of an idle pattern is suppressed more effectively than where no dither is added. This can be confirmed spectrally by the fact that whitening acts strongly in the audio band. It can also be confirmed in terms of the output waveform by the fact that the differential waveform is reduced and the reproducibility of the waveform is improved.

Where a digital-to-digital (D/D) converter for converting a 24-bit input signal into a 1-bit output signal is built with the noise shaper 1 as in the present embodiment, the circuit scale can be reduced effectively by placing the dither adder 17 before the quantizer 16. That is, the signal line from the quantizer 16 to the coefficient multipliers 12, 13, 14 is only required to be 1 bit. Each coefficient multiplier is only required to expand data to an amount obtained by multiplying a coefficient of 24 bits. On the other hand, if the dither adder 17 were placed behind the quantizer 16, then a 1-bit signal would be returned to 24 bits and then a dither signal would be added. Consequently, data would be supplied to each coefficient multiplier by a 24-bit signal line. This would increase the circuit scale.

In the present embodiment, the pattern of the dither signal is varied at a frequency that is $1/16$ to $1/8$ of the oversampling frequency. Therefore, it is easy to separate the signal from the dither signal component in a rear stage. In other words, it is possible to alleviate the load on the low-pass filter placed behind the noise shaper. That is, the lower limit of the frequency of the clock for the dither adder 17 is preferably so determined that noise induced by repetition of the dither signal will not appear in the audio band, if the noise shaper is used in a D/A (digital-to-analog) converter. The upper limit is so determined that a low-pass filter placed after the noise shaper can remove the aforementioned noise.

In the embodiment described above, the order of the noise shaper is third. It is to be noted that the present invention is not limited to this structure. The invention yields great advantages especially in higher-order pole-shifted noise shapers in which signals attenuate greatly as described above.

Furthermore, in the embodiment described above, the noise shaper 1 forms a digital-to-digital (D/D) converter for converting a 24-bit input signal into a 1-bit output signal. The invention is not limited to this structure. The invention can also be applied to one equipped with a quantizer with a multi-bit output (e.g., a noise shaper for converting a 24-bit input signal into a 4-bit output signal).

The present invention provides a pole-shifted noise shaper in which the pole on the Z-plane of the transfer function has been shifted out of the origin, the noise shaper being characterized in that a dither adder is placed immediately ahead of a quantizer, whereby a dither signal is added to data about to be applied to the quantizer. Consequently, attenuation of the dither signal due to noise shaping can be suppressed effectively, and the idle pattern appearing in the output signal can be suppressed. Furthermore, the effects of attenuation of the dither signal due to noise shaping can be suppressed further by setting the level of the dither signal to $1/16$ to $1/8$ of the maximum amplitude, or the MSB, of the input data.

In addition, the pattern of the dither signal is varied at the operating clock frequency, i.e., at a frequency that is $1/16$ to $1/8$ of the oversampling frequency. Therefore, the frequency of noise component due to the dither signal lowers. This makes it easy to separate the signal and the dither signal component in a rear stage.

What is claimed is:

1. A pole-shifted noise shaper comprising:
   a quantizer for outputting a quantized output signal based on a quantizer data input signal;
   an input transfer function section providing a transfer function having a Z-plane pole has been shifted out of a Z-plane origin, said transfer function section receiving a data input signal and providing a transfer section output; and
   a dither adder for adding a dither signal to the transfer section output to provide said quantizer data input signal to said quantizer.

2. The noise shaper of claim 1, wherein said dither signal varies periodically independent of said data input signal and has a spectrum based on a certain frequency that is higher than audio band frequencies and lower than a frequency of an operating clock signal of said noise shaper.

3. The noise shaper of claim 2, wherein said dither signal is produced based on a certain pattern consisting of a combination of "1" and "0", and wherein said dither adder produces said dither signal by sequentially selecting bits of said certain pattern at said certain frequency and giving a certain level to said selected bits.

4. The noise shaper of claim 2 or 3, wherein said data input signal is a multi-bit digital signal and is converted into a 1-bit digital signal.

5. The noise shaper of claim 4, wherein said dither signal has a level that is $1/16$ to $1/8$ of a maximum amplitude given by a most significant bit of said data input signal.

6. The noise shaper of claim 5, wherein said data input signal is a multi-bit digital signal and is converted into a 1-bit digital signal.

7. The noise shaper of claim 2 or 3, wherein said certain frequency has a frequency that is $1/16$ to $1/8$ of the frequency of said operating clock signal.

8. The noise shaper of claim 7, wherein said dither signal has a level that is $1/16$ to $1/8$ of a maximum amplitude given by a most significant bit of said data input signal.

9. The noise shaper of claim 7, wherein said data input signal is a multi-bit digital signal and is converted into a 1-bit digital signal.

10. The noise shaper of claim 2 or 3, wherein said dither signal has a level that is $1/16$ to $1/8$ of a maximum amplitude given by a most significant bit of said data input signal.

* * * * *